US006943581B1

(12) United States Patent
Cruz et al.

(10) Patent No.: US 6,943,581 B1
(45) Date of Patent: Sep. 13, 2005

(54) TEST METHODOLOGY FOR DIRECT INTERCONNECT WITH MULTIPLE FAN-OUTS

(75) Inventors: Arnold Abrera Cruz, Fremont, CA (US); Randy J. Simmons, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/402,824

(22) Filed: Mar. 27, 2003

(51) Int. Cl.[7] ............................................. H01L 25/00
(52) U.S. Cl. .............................. 326/41; 326/38; 326/39
(58) Field of Search .............................. 326/16, 38, 39, 326/40, 41, 46, 9, 12

(56) References Cited

U.S. PATENT DOCUMENTS

| | | | |
|---|---|---|---|
| 4,642,487 A | | 2/1987 | Carter |
| 5,469,003 A | | 11/1995 | Kean |
| 5,500,608 A | * | 3/1996 | Goetting et al. ............... 326/39 |
| 5,546,018 A | * | 8/1996 | New et al. ..................... 326/38 |
| 5,570,041 A | * | 10/1996 | El-Avat et al. ................ 326/41 |
| 5,581,199 A | | 12/1996 | Pierce et al. |
| 5,621,337 A | * | 4/1997 | Childs .......................... 326/46 |
| 5,675,589 A | * | 10/1997 | Yee ............................... 714/30 |
| 5,818,255 A | * | 10/1998 | New et al. ..................... 326/39 |
| 6,201,408 B1 | * | 3/2001 | Skahill et al. ................ 326/39 |
| 6,239,611 B1 | * | 5/2001 | Matera ......................... 326/16 |
| 6,292,022 B2 | | 9/2001 | Young et al. |

OTHER PUBLICATIONS

Xilinx, Inc., "The Programmable Logic Book 1998," Nov. 10, 1997, V. 1.4, Chapter 4, pp. 4-1 through 4-374, available from Xilinx Inc., 2100 Logic Drive, San Jose, CA., 95124.
Xilinx, Inc., "Virtex-II Pro Platform FPGA Handbook" Oct. 14, 2002, Version 2.0, pp. 49-64, available from Xilinx Inc., 2100 Logic Drive, San Jose, CA., 95124.

* cited by examiner

Primary Examiner—Michael Tokar
Assistant Examiner—Linh Nguyen
(74) Attorney, Agent, or Firm—William L. Paradice, III; Justin Liu (57) ABSTRACT

A test cell and method of operation are disclosed. The test cell may be cascaded with other test cells to form a test structure that spans across any number of slices and/or tiles in a programmable logic device. The test structure behaves like a register, and may be used to test direct interconnects and any number their fan-out lines simultaneously.

38 Claims, 10 Drawing Sheets

TEST METHODOLOGY FOR DIRECT INTERCONNECT WITH MULTIPLE FAN-OUTS

FIELD OF INVENTION

The present invention relates generally to testing semiconductor circuits, and specifically to testing interconnections among integrated circuit elements.

DESCRIPTION OF RELATED ART

A programmable logic device (PLD) is a general purpose device that can be programmed by a user to implement a variety of selected functions. One type of PLD is the Field Programmable Gate Array (FPGA), which typically includes an array of configurable logic blocks (CLBs) surrounded by a plurality of input/output blocks (IOBs). The CLBs are individually programmable and can be configured to perform a variety of logic functions on a few input signals. The IOBs can be configured to drive output signals from the CLBs to external pins of the FPGA and/or to receive input signals from the external FPGA pins. The FPGA also includes a general interconnect structure that can be programmed to selectively route signals among the various CLBs and IOBs to produce more complex functions of many input signals. The CLBs, IOBs, and the general interconnect structure are programmed by loading configuration data into associated memory cells that control various switches and multiplexers within the CLBs, IOBs, and the interconnect structure to implement logic and routing functions specified by the configuration data.

Early CLB architectures typically included two function generators, each having four inputs to receive signals from other CLBs and/or IOBs, and at least one output that may be connected to a corresponding flip-flop. These function generators, which are typically implemented as look-up tables, may be programmed to perform any Boolean logic function of their inputs. The two function generators and their corresponding flip-flops are commonly referred to as a CLB slice. Further information regarding various FPGA architectures may be found in "The Programmable Logic DataBook 1998," Chapter 4, pages 1–374, available from Xilinx, Inc. of San Jose, Calif., and incorporated by reference herein.

As FPGAs become larger and more complex, the general interconnect structure must also become larger and more complex. To improve performance, direct line connections are provided to route signals between adjacent CLBs without having to access the general interconnect structure. To ensure proper operation and reliability, these direct lines between CLBs are tested for stuck-at-high faults and stuck-at-low faults.

As known in the art, stuck-at-high faults may be detected using logic OR functions, and stuck-at-low faults may be detected using logic AND functions. Thus, conventional techniques for testing the direct lines and their fan-outs typically involve configuring an upper portion of a slice (e.g., a first function generator) to implement a logic AND function, and configuring a lower portion of the slice (e.g., a second function generator) to implement a logic OR function. The AND function generates an output signal indicative of stuck-at-low faults for a first fan-out, and the OR function generates an output signal indicative of stuck-at-high faults for a second fan-out. Then, the configurations of the function generators are reversed such that the upper portion of the slice tests the first fan-out for stuck-at-high faults and the lower portion of the slice tests the second fan-out for stuck-at-low faults. For each configuration, the output signals are routed to some observable point and examined to determine whether any faults exist.

Although this technique is effective in detecting stuck-at faults, two test configurations are required to test each direct line fan-out. Thus, as CLB architectures become more complex and include increasing numbers of slices, the number of direct line fan-outs also increases, which in turn results in a corresponding increase in the number of test patterns required for fault testing.

SUMMARY

An apparatus and method are disclosed that allow any number of the fan-outs associated with a direct line connected between adjacent CLB tiles to be tested simultaneously for faults. In accordance with the present invention, a test cell is implemented in a portion of a CLB slice using existing slice resources. For some embodiments, the test cell is implemented using a function generator and a flip-flop in the slice. The test cell receives an input signal (e.g., a test vector) via a corresponding direct line fan-out and generates a registered output signal that tracks changes in the input signal. The test cell behaves like a register, and therefore can be connected with another test cell implemented in the slice to form a 2-bit test structure, with each test cell receiving the input signal via a corresponding direct line fan-out. The 2-bit test structure generates a single output signal that tracks the input signal, and thus also behaves like a register. As a result, these test structures can be implemented in various slices and then connected together to form a shift register that spans an entire CLB tile, thereby allowing a direct line and all of its slice fan-outs to be simultaneously tested using the same configuration. In this manner, test structures of the present invention can significantly reduce the number of test vectors required to test the direct line fan-outs, thereby reducing testing time and costs.

Further, the test structures implemented in the various CLB tiles can be connected together to form a shift register that spans an entire CLB array, thereby allowing a test vector to be shifted through any number of CLB tiles.

For other embodiments, test cells of the present invention can be used to test the flip-flop inputs within CLB slices. Thus, for one embodiment, the test cells can be used to test the flip-flop clock enable inputs. For another embodiment, the test cells can be used to test the flip-flop set and/or reset inputs.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

Embodiments of the present invention are discussed below in the context of testing the direct interconnect lines between adjacent tiles of an FPGA for simplicity only. It is to be understood that embodiments of the present invention are equally applicable for testing other interconnect lines, and can be used for testing any suitable device that has repeatable logic tiles including, for example, programmable logic arrays (PLAs) and complex programmable logic devices (CPLDs). In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention. Additionally, the interconnection between circuit elements or blocks may be shown as buses or as single signal lines. Each of the buses may alternatively be a single signal line, and each of the single signal lines may alternatively be a bus. Further, the logic levels assigned to various signals in the description below are arbitrary and, thus, may be modified (e.g., reversed polarity) as desired. Accordingly, the present invention is not to be construed as limited to specific examples described herein but rather includes within its scope all embodiments defined by the appended claims.

Figure 1:
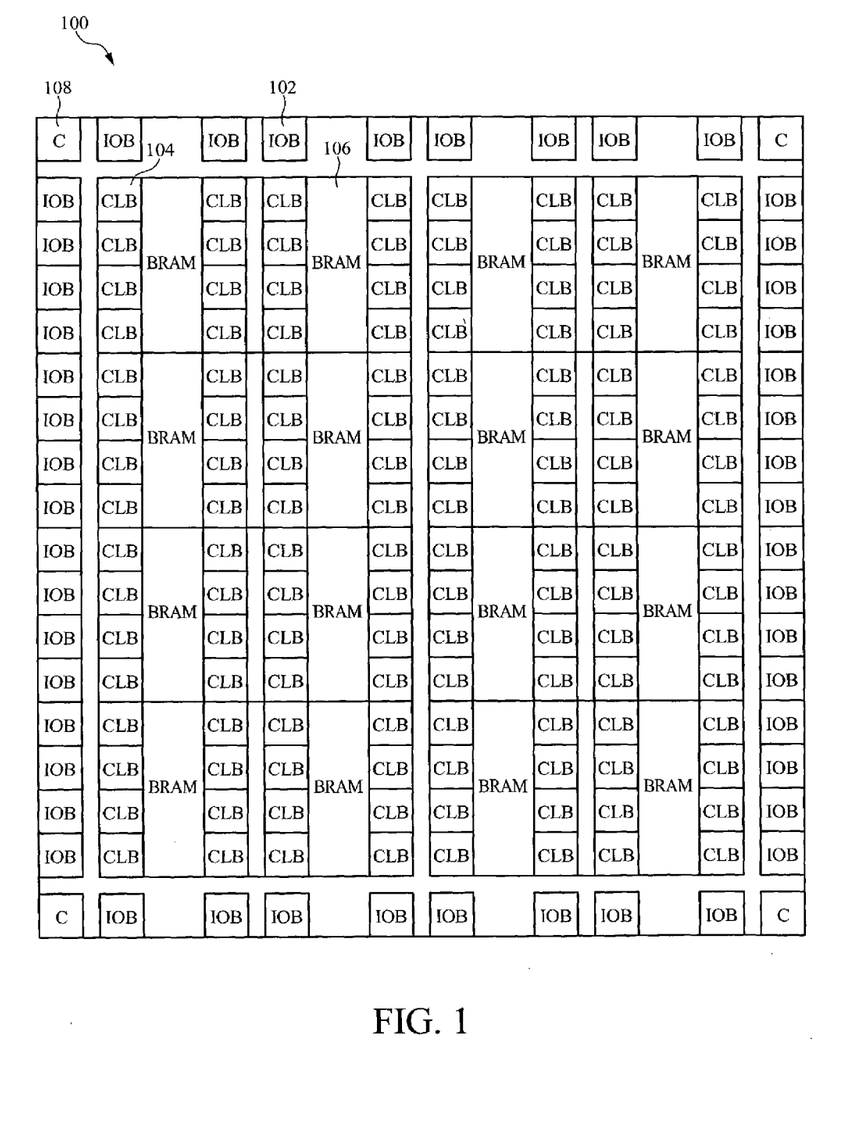
FIG. 1 is a block diagram illustrating the general layout of an FPGA within which embodiments of the present invention can be implemented.

FIG. 1 illustrates the general layout of IOBs, CLBs, and block RAMs (BRAMs) of a field programmable gate array (FPGA) 100 within which some embodiments of the present invention can be implemented. IOBs 102 are well-known, and are located around the perimeter of FPGA 100. CLBs 104 are well-known, and are arranged in columns in FPGA 100. Block RAMs 106 are well-known, and are arranged in columns between adjacent CLB columns. A well-known general interconnect circuitry (not shown for simplicity) is provided to programmably connect the IOBs 102, CLBs 104, and block RAMs 106. Corner blocks 108 are well-known, and can contain configuration circuitry and/or can be used to provide additional routing resources. Although a particular FPGA layout is illustrated in FIG. 1, it is to be understood that many other FPGA layouts are possible, and are considered to fall within the scope of the present invention. For example, other embodiments can have other numbers of IOBs 102, CLBs 104, and block RAMs 106, and can have other types of blocks, such as multipliers or processors. A more detailed description of the general operation of FPGA 100 is provided in "The Programmable Logic Databook 1998"Chapter 4, pages 1–374, available from Xilinx, Inc. of San Jose, Calif., and incorporated by reference herein.

Figure 2:
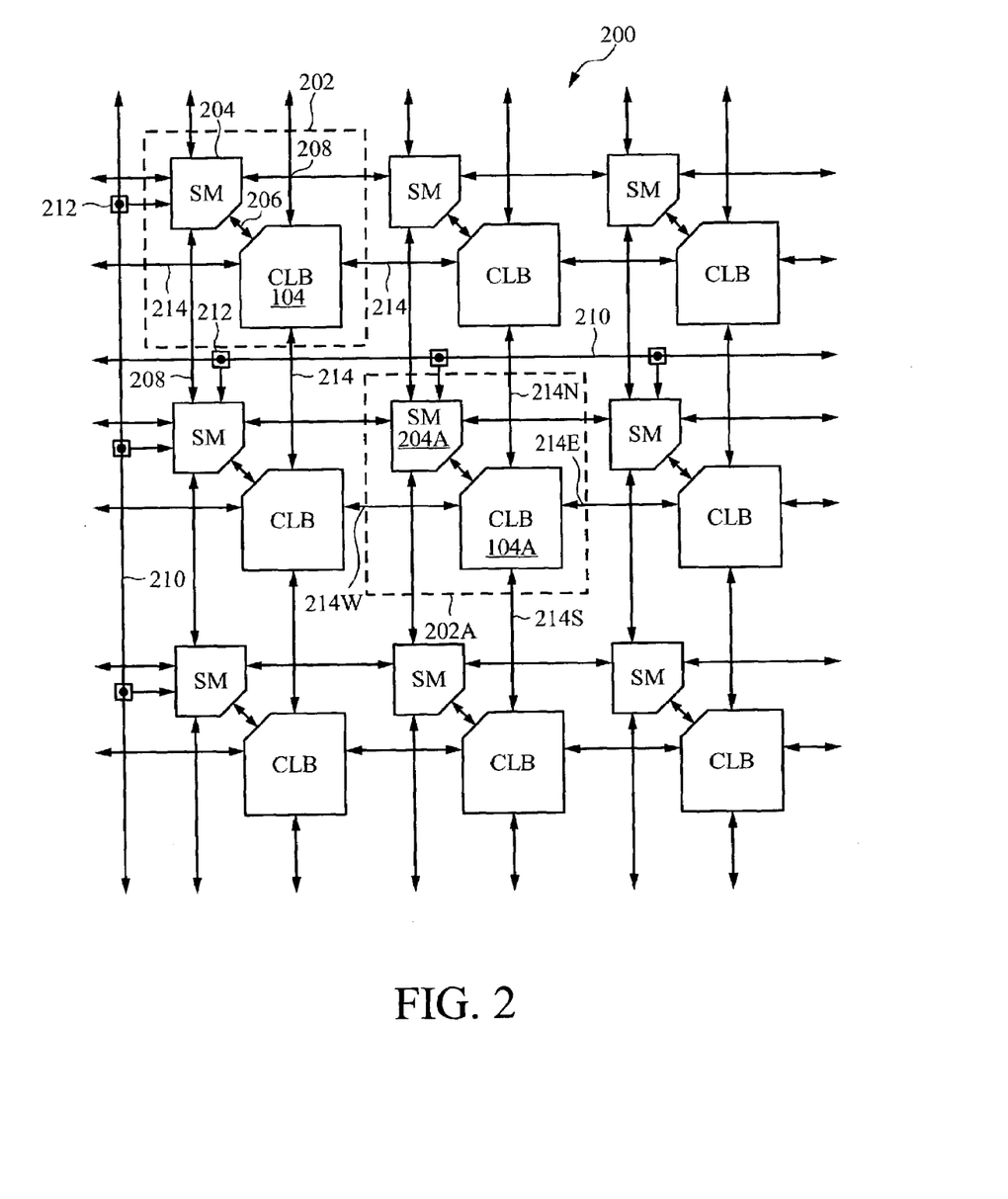
FIG. 2 is simplified block diagram illustrating representative interconnections between some of the CLB tiles of the FPGA layout of FIG. 1.

FIG. 2 shows a portion 200 of FPGA 100 in more detail. FPGA portion 200 is shown to include nine CLB tiles 202, where each CLB tile includes a CLB 104, a switch matrix 204, and signal lines 206 connecting the CLB 104 to the switch matrix 204. Switch matrix 204 is well-known, and connects the CLB 104 to other tiles using general routing resources. For some embodiments, switch matrix 204 is of the type disclosed in U.S. Pat. No. 6,292,022 to Young et al., which is incorporated herein by reference, although other switch matrices can be used. Signal lines 208, which extend across one CLB tile to connect switch matrices 204 in adjacent tiles 202, are commonly known as single-length lines. Interconnect lines 210, which extend across multiple CLB tiles and can be selectively connected to switch matrices 204 via well-known programmable interconnect points (PIPs) 212, are representative of intermediate length lines (e.g., double-length lines, quad-length lines, hex-length lines, octal-length lines, and so on) and long lines (e.g., lines that extend across an entire row or column of FPGA 100). For simplicity, only two lines 210 are shown. Together, lines 208, lines 210, and PIPs 212 form the general interconnect circuitry for FPGA 100.

For one embodiment, the general interconnect circuitry is of the type disclosed in U.S. Pat. No. 5,469,003 to Kean, which is incorporated herein by reference. For another embodiment, the tile-based interconnect structure disclosed in U.S. Pat. No. 5,581,199 to Pierce, which is incorporated herein by reference, can be used. For other embodiments, other general interconnect circuitry can be used.

In addition, FPGA 100 includes a number of signal lines 214 that route signals directly between CLBs 104 in adjacent tiles, e.g., without going through switch matrices 204 and the general interconnect circuitry. Direct lines 214 are well-known, and improve performance by providing fast signal routing between CLBs. For some embodiments, direct lines 214 are of the type disclosed in U.S. Pat. No. 4,642,487 to Carter, which is incorporated herein by reference, although other direct lines can be used. As shown in FIG. 2, each CLB 104 is connected directly via lines 214 to adjacent CLBs in the same row and the same column, e.g., to CLBs in adjacent tiles to the north, south, east, and west. For example, CLB 104A includes direct connections to the CLBs 104 in adjacent tiles to the north, south, east, and west via direct lines 214N, 214S, 214E, and 214W, respectively. However, although not shown in FIG. 2, each CLB 104 can include direct lines connecting to the CLBs in diagonally adjacent tiles, i.e., to CLBs in tiles to the northeast, northwest, southwest, and southeast.

Figure 3:
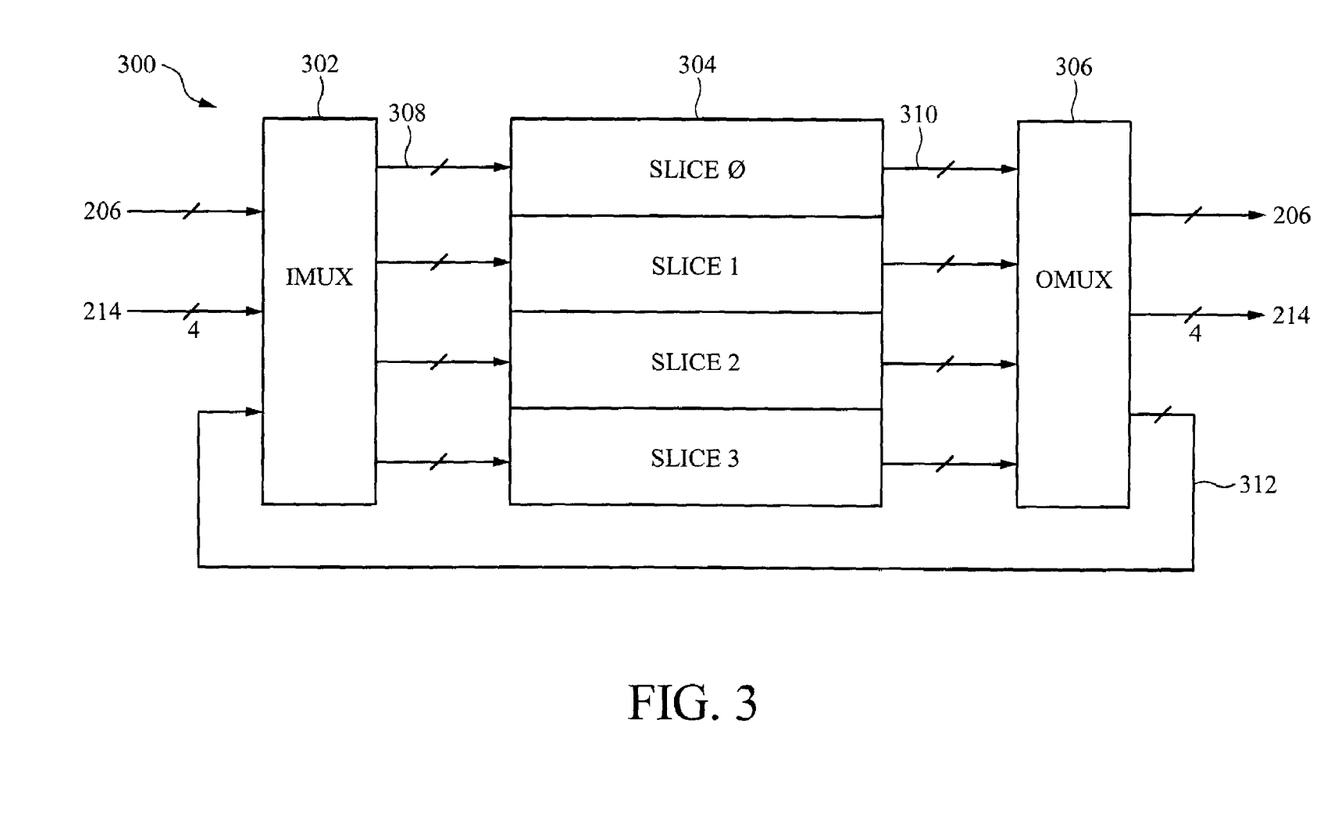
FIG. 3 is a simplified block diagram of a CLB tile of FIG. 2.

FIG. 3 is a block diagram of a CLB 300 that is one embodiment of CLB 104 of FIG. 2. CLB 300 includes an input multiplexer (IMUX) 302, a configurable logic element (CLE) 304, and an output multiplexer (OMUX) 306. IMUX 302 is well-known, and routes input signals to CLE 304 via lines 308. IMUX 302 receives input signals from switch matrix 204 (not shown in FIG. 3) via lines 206, and receives input signals from adjacent tiles via input four direct lines 214. For other embodiments, other numbers of direct lines 214 can be provided to CLB 300. CLE 304 includes four well-known CLE slices that can be programmed to implement various logic functions and/or memory elements. For other embodiments, CLE 304 can include other numbers of slices.

OMUX 306 is well-known, and routes output signals from CLE 304 via lines 310. OMUX 306 provides output signals from CLE 304 to switch matrix 204 (not shown in FIG. 3) via lines 206 and to adjacent tiles via four direct connect lines 214. The CLE output signals provided by OMUX 306 on lines 206 can be routed back to corresponding IMUX 302 or to other tiles via the general interconnect circuitry. Feedback lines 312 are provided to route selected output signals from CLE 304 to IMUX 302 via OMUX 306 without going through the general interconnect circuitry. Further, although not shown in FIG. 3 for simplicity, additional feedback lines can be provided to route signals from CLE slices 304 to IMUX 302 without going through OMUX 306.

As mentioned above, IMUX 302, CLE slices 304, and OMUX 306 are well-known logic structures. For some embodiments, IMUX 302, CLE slices 304, and OMUX 306 are of the type disclosed in U.S. Pat. No. 6,292,022 to Young et al, which is referenced above. For other embodiments, other well-known structures can be used for IMUX 302, CLE slices 304, and OMUX 306. Thus, for example, the CLE slices described in the "Virtex-II Pro Platform FPGA Handbook" October 2002, pages 49–64, available from Xilinx, Inc. of San Jose, Calif., which is incorporated herein by reference, can be used in present embodiments.

Figure 4:
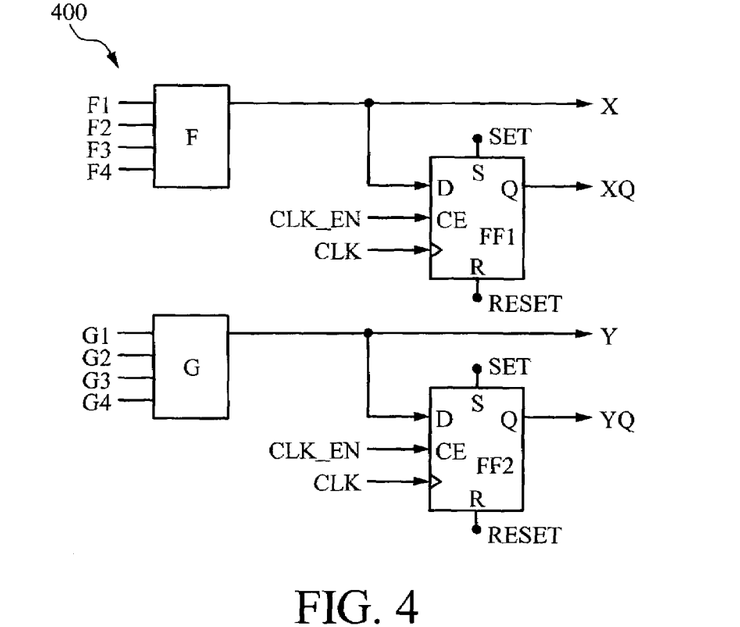
FIG. 4 is a simplified block diagram of one embodiment of a slice within the tile embodiment of FIG. 3.

FIG. 4 is a simplified functional diagram of a CLE slice 400 that is one embodiment of CLE slices 304 of FIG. 3. Slice 400 is shown to include two function generators F and G, and two flip-flops FF1 and FF2. Function generators F and G are well-known 4-input look-up tables that can be configured to implement any Boolean logic function of their input signals to generate respective output signals X and Y. For some embodiments, each function generator F and G can also be configured as a 16-bit shift register or as a 16×1 RAM. The four inputs F1–F4 of function generator F and the four inputs G1–G4 of function generator G can receive input signals from lines 206, from direct lines 214, and/or from feedback lines 312 via IMUX 302 (see also FIG. 3).

Flip-flop FF1 has a data input D to receive an output signal X from function generator F, and provides a registered output signal XQ. Similarly, flip-flop FF2 has a data input D to receive an output signal Y from function generator G, and provides a registered output signal YQ. In addition, flip-flops FF1 and FF2 each have a clock input (>) to receive a clock signal CLK, a clock enable input CE to receive a clock enable signal CLK_EN, and S/R inputs to receive set and reset signals, respectively.

Other well-known elements of slice 400 such as additional function generators, signal routing multiplexers, cascade logic, fast carry chains, and control signals, are not shown in FIG. 4 for simplicity. For more information on the architecture and operations of slice 400, refer to the above referenced, "The Programmable Logic Databook 1998," Chapter 4, pages 1–374.

Figure 4A:
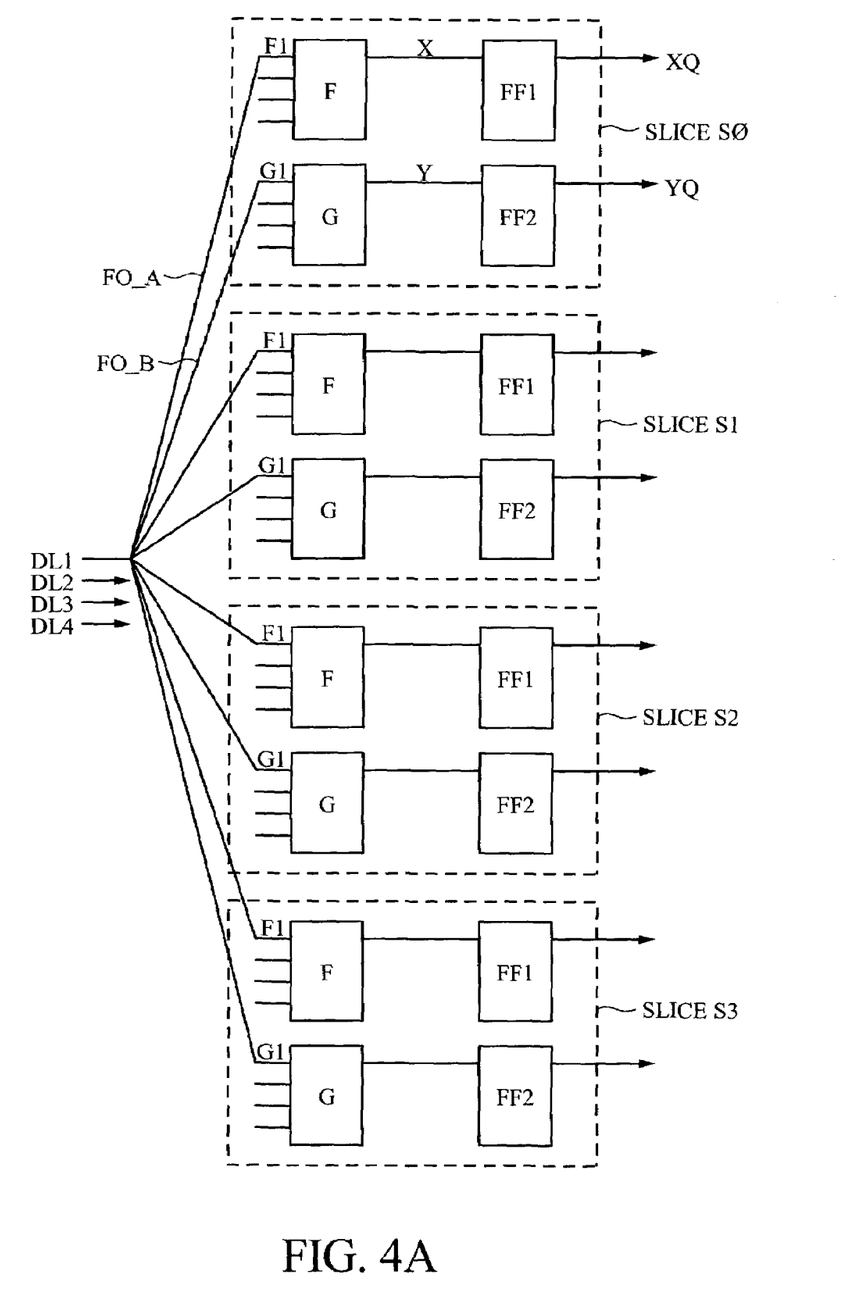
FIG. 4A is block diagram illustrating the fan-outs for a direct line connection to the tile of FIG. 3.

FIG. 4A illustrates the direct line fan-outs for an exemplary embodiment of FIGS. 3 and 4, where each direct line 214 can be connected to a corresponding F input and a corresponding G input in all four slices 400 of CLB 300. For example, a first direct line DL1 is shown coupled to the first input F1 of each function generator F in each slice S0–S3 and to the first input G1 of each function generator G in each slice S0–S3, thereby resulting in 8 fan-outs for the direct line DL1. Although not shown in FIG. 4A for simplicity, the other direct lines DL2–DL4 are each connected to corresponding F inputs and G inputs of each slice S0–S3, and therefore also have 8 fan-outs. Of course, for other embodiments, each direct line 214 can have a fewer or a greater number of fan-outs.

Figure 5:
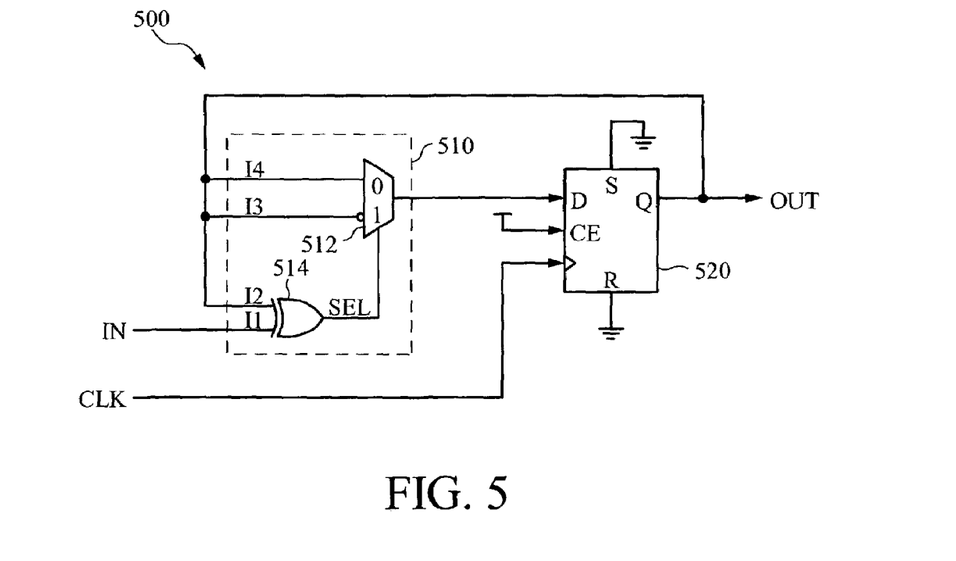
FIG. 5 is a circuit diagram illustrating one embodiment of a test cell that can be implemented within the slice of FIG. 4.

In accordance with the present invention, corresponding pairs of function generators and flip-flops within CLE slices are configured to implement test cells that can be connected together to form a shift register (e.g., a test counter) that can be used to test a direct line and any number of its fan-outs simultaneously. FIG. 5 illustrates one embodiment of a test cell that can be implemented in either the upper or lower portion of slice 400. Test cell 500 is implemented using a function generator 510 and a flip-flop 520. Function generator 510 can be either function generator F or G of slice 400, and flip-flop 520 can be the corresponding flip-flop FF1 or FF2 of slice 400. Function generator 510, which is configured to implement a clock enable circuit for flip-flop (FF) 520, has a first input I1 to receive an input test signal IN provided by a selected direct line fan-out, and three inputs I2–I4 to receive an output test bit OUT from corresponding flip-flop (FF) 520. Thus, inputs I1–I4 can correspond to either inputs F1–F4 of function generator F or inputs G1–G4 of function generator G. The output signal OUT can be routed from FF 520 to function generator 510 through OMUX 306 and IMUX 302 via feedback lines 312, or through lines 206 and the general interconnect circuitry (see also FIG. 3). For this configuration, FF 520 has its clock enable input tied to $V_{cc}$ (e.g., asserted to logic high), and has its S/R inputs grounded (e.g., de-asserted to logic low).

The clock enable circuit implemented by function generator 510 is functionally represented by a multiplexer (MUX) 512 and an XOR gate 514 configured as shown in FIG. 5. MUX 512 has a first input to receive OUT from FF 520 via I4, a second inverted input to receive $\overline{OUT}$ via I3, an output coupled to the D-input of FF 520, and a select terminal to receive a select signal SEL generated by XOR gate 514. The second input to MUX 512 is inverted so that the two input signals to MUX 512 are opposite logic states. XOR gate 514 has inputs to receive IN via I1 and OUT via I2, and an output to generate SEL.

During operation, XOR gate 514 compares IN and OUT to generate SEL. Specifically, if IN equals OUT, then XOR gate 514 drives SEL to logic high, and MUX 512 provides OUT to the D-input of FF 520, thereby maintaining OUT in its current state. Conversely, if IN does not equal OUT, XOR gate 514 drives SEL to logic low, and MUX 512 provides $\overline{OUT}$ to the D-input of FF 520, thereby toggling OUT to the opposite state. Accordingly, the test cell 500 of FIG. 5 behaves like a register, whereby FF 520 updates (e.g., toggles) the test bit OUT only when the sampled input signal IN changes.

To test the path from the direct line fan-out at I1 to the FF output Q for stuck-at faults, SEL is set to logic high, and IN is toggled from logic low to logic high, and then from logic high to logic low. Conversely, to test the feedback path from I4 to output Q for stuck-at faults, SEL is set to logic low, and IN is maintained at logic high for two test clock cycles and then transitioned to logic low for two test cycles. In this manner, a test vector can be shifted through test cell 500 and observed to detect faults in the direct line fan-out under test.

Figure 6:
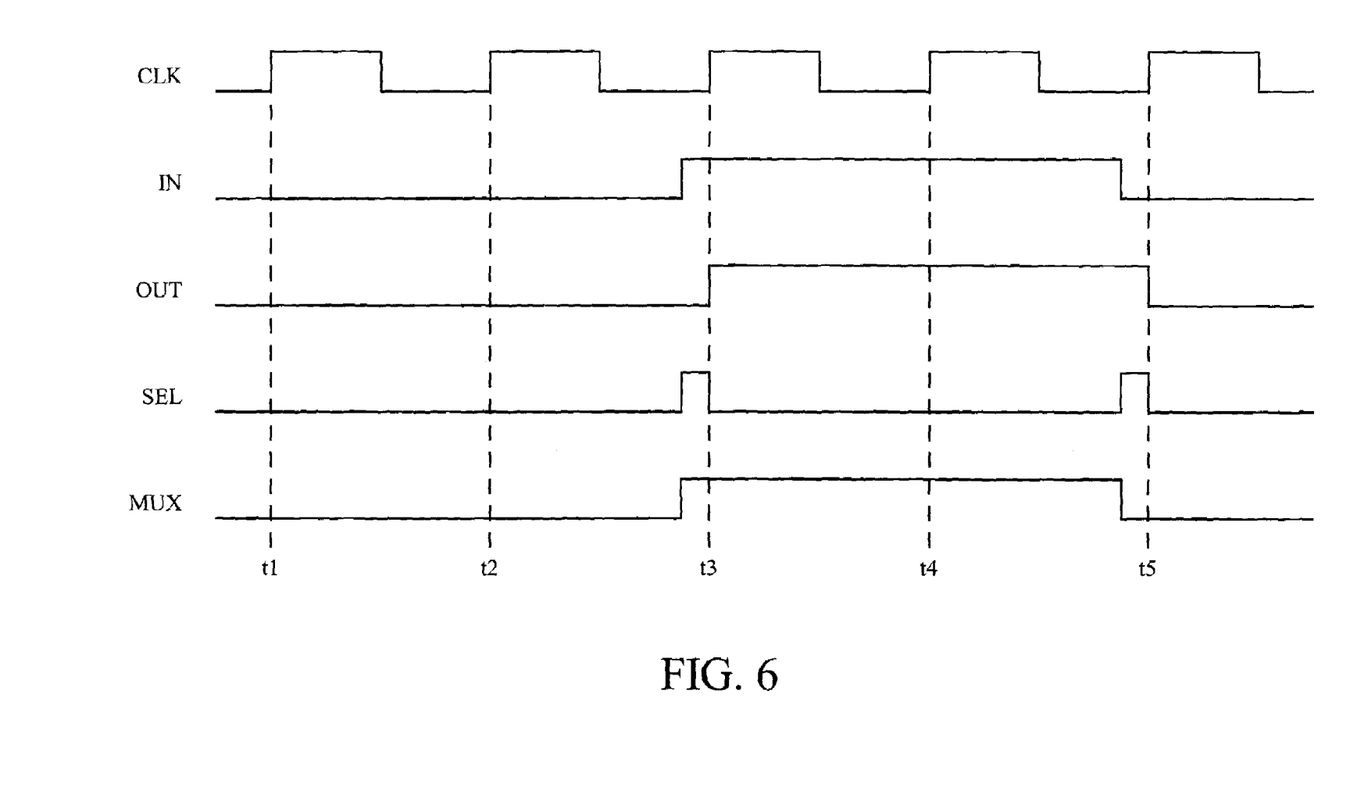
FIG. 6 is a qualitative timing diagram for an exemplary test vector applied to the test cell of FIG. 5.

For example, one test vector that tests both paths through test cell 500 for stuck-at faults can be "00110," the application of which to test cell 500 is illustrated in the qualitative timing diagram of FIG. 6 (of course, other suitable test vectors can be used). Referring to FIG. 6, FF 520 is initialized to logic low so that OUT=0. The test vector is then applied to test cell 500 from a direct line fan-out via I1. Prior to time t1, the initial logic low value of IN is provided to I1. Thus, because IN=OUT=0, XOR gate 514 drives SEL to logic low, and MUX 512 routes the logic low signal OUT to the D-input of FF 520. At time t1, the logic low signal from MUX 512 is clocked into FF 520. At time t2, IN remains logic low, which causes MUX 512 to recycle the logic low signal OUT to FF 520, thereby maintaining OUT in the logic low state. Prior to time t3, IN toggles to logic high, which causes XOR gate 514 to drive SEL to logic high. In response thereto, MUX 512 routes the inverted output signal (i.e., $\overline{OUT}$=1) to FF 520. At time t3, the rising clock edge clocks the logic high signal into FF 520, thereby updating OUT to logic high.

Because OUT equals IN (i.e., IN=OUT=1), XOR gate 514 returns SEL to logic low. IN is maintained in the logic high state for another clock cycle, which causes XOR gate 514 to maintain SEL in its logic low state. Thus, at time t4, IN remains logic high, which causes MUX 512 to recycle the logic high signal OUT to FF 520, thereby maintaining OUT in the logic high state. Just before time t5, IN toggles to logic low, which causes XOR gate 514 to drive SEL to logic high. IN response thereto, MUX 512 routes the inverted output signal (i.e., $\overline{OUT}$=0) to FF 520. At time t5, the rising clock edge clocks the logic low value into FF 520, which in turn updates OUT to logic low. In response thereto, XOR gate 514 returns SEL to logic low.

For other embodiments, FF 520 can be a negative edge-triggered device.

Figure 7:
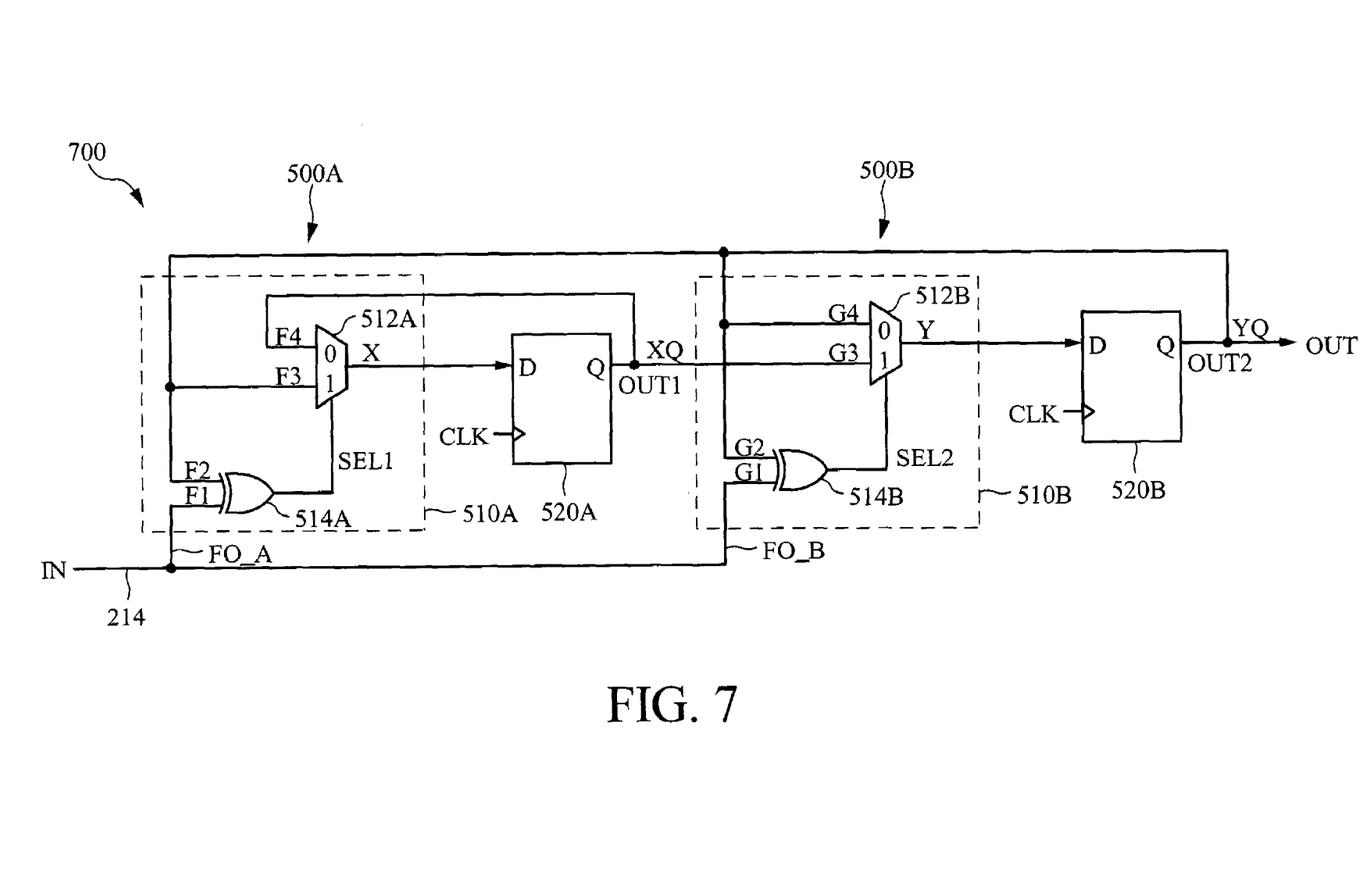
FIG. 7 is a circuit diagram illustrating the cascade connection of two of the test cells of FIG. 5.

Test cell 500 can be connected (e.g., cascaded) with another test cell in the same slice 400 to form a 2-bit test register capable of simultaneously testing 2 direct line fan-outs for faults. For example, FIG. 7 illustrates the cascade configuration of two test cells 500A and 500B that can be implemented in slice 400 of FIG. 4, where logic function 510A is implemented in the F function generator and logic function 510B is implemented in the G function generator. The input signal IN is applied on a direct line 214 under test, and simultaneously provided to input F1 of test cell 500A and to input G1 of test cell 500B via corresponding fan-outs FO_A and FO_B, respectively. The test structure's output signal OUT is generated at register output YQ and provided as feedback to XOR gates 514A and 514B via inputs F2 and G2, respectively. XOR gates 514A and 514B compare IN and OUT to generate multiplexer select signals SEL1 and SEL2, respectively. MUX 512A has a first input to receive a first test bit OUT1 from FF 520A's output XQ via input F4, a second input to receive the test structure output signal OUT (e.g., a second test bit OUT2) from FF 520B's output YQ via input F3, an output coupled to the D-input of FF 520A, and a select terminal to receive SEL1. MUX 512B has a first input to receive OUT from FF 520B via input G4, a second input to receive OUT1 from FF 520A via input G3, an output coupled to the D-input of FF 520B, and a select terminal to receive SEL2. For simplicity, the clock enable and S/R signals for FF 520A and FF 520B are not shown in FIG. 7.

Thus, during test operations, the input test signal IN is simultaneously provided to test cells 500A and 500B via respective function generator inputs F1 and G1 to generate a single output test signal OUT at slice output YQ. The output test signal OUT at YQ can then be observed (e.g., compared to the input test signal) to detect faults in both direct line fan-outs FO_A and FO_B. The various feedback signals can be routed from FF outputs XQ and YQ to the F2–F4 inputs of test cell 500A and to the G2–G4 inputs of test cell 500B using feedback lines 312 and/or the general interconnect circuitry described above with respect to FIGS. 2 and 3, thereby not interfering with the fan-outs under test.

The fan-outs of other direct lines 214 can be simultaneously tested in a similar manner by re-configuring the test cells 500A and 500B to receive the input test vector IN from other direct lines. For example, to test the fan-outs of a second direct line, test cells 500A and 500B can be re-configured so that IN is provided to XOR gates 514A and 514B via function generator inputs F2 and G2, respectively. For some embodiments, the same test vectors may be used to test each of the direct lines and their fan-outs.

Figure 8:
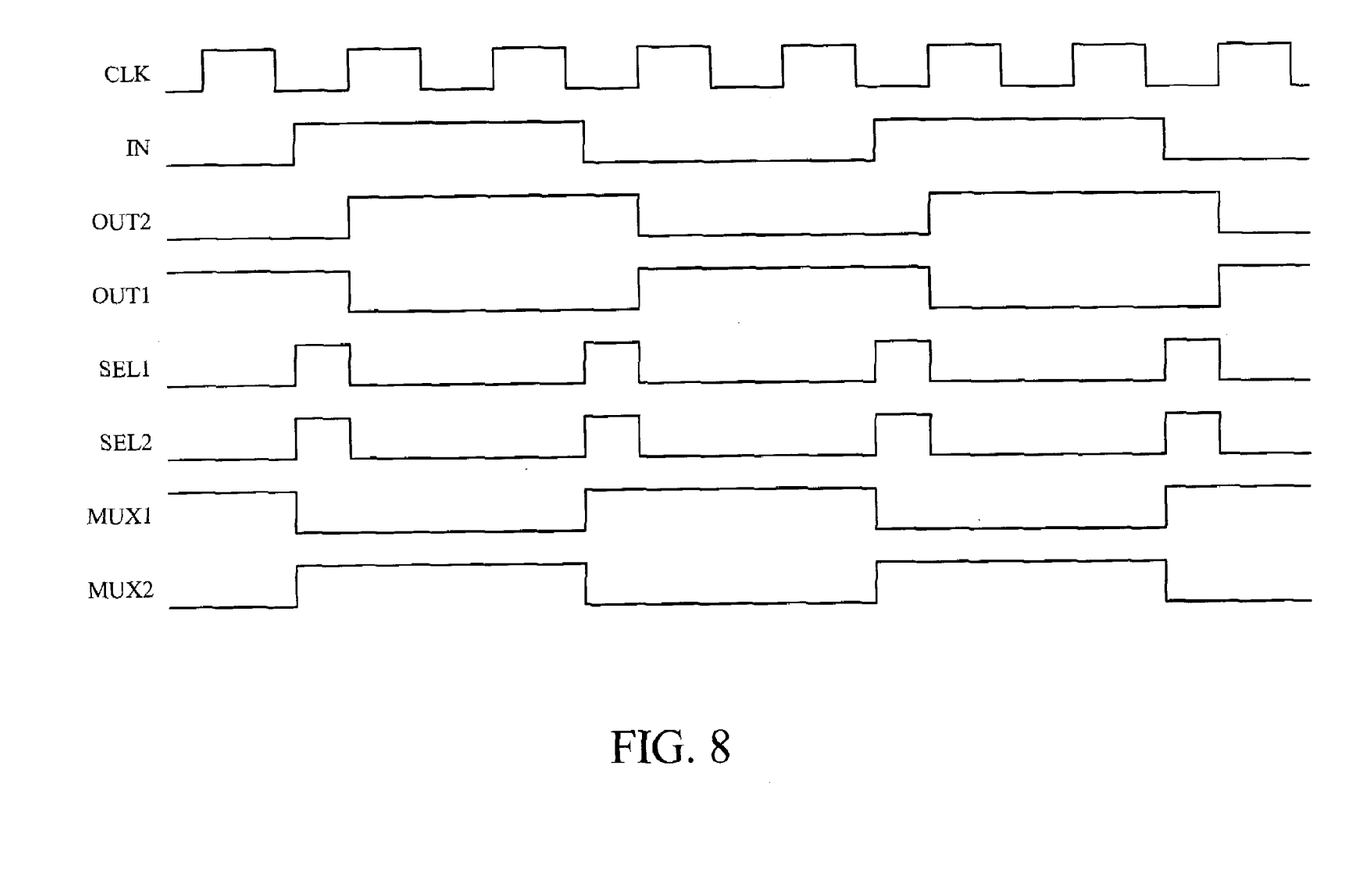
FIG. 8 is a qualitative timing diagram for an exemplary test vector applied to the test structure of FIG. 7.

FIG. 8 shows a qualitative timing diagram for an exemplary test vector "01100110" applied to test structure 700, where the second FF 520B is initialized to logic low and the first FF 520A is initialized to logic high. In addition, note that the F3 input to MUX 512A and the G3 input to MUX 512B are non-inverted. In this manner, the first and second inputs to MUXes 512A and 514B are opposite logic states.

Because test structure 700 behaves like a register in a manner similar to that of test cell 500, any number of test structures 700 (as well as individual test cells 500) can be cascaded together across slice boundaries to form a test register that can be used to test any number of direct line fan-outs simultaneously for faults. For example, referring also to FIG. 4A, test structures 700 implemented in all four slices S0–S3 of an FPGA can be connected together as described above to form a shift register that spans an entire CLB tile to generate a single output signal, thereby allowing all 8 fan-outs of a direct line to be simultaneously tested for faults. Further, the test cells 500 and/or test structures 700 implemented in various CLB tiles can be connected together to form a shift register that spans an entire CLB array.

In general, when cascading multiple test cells 500 together to form a shift register, adjacent test cells are initialized to opposite states. Thus, for some embodiments, the flip-flop in the last test cell is initialized to logic zero, the flip-flop in the second-to-last test cell is initialized to logic one, the flip-flop in the third-to-last test cell is initialized to logic zero, and so on, as described above for the exemplary operation of the test structure embodied in FIG. 7. For other embodiments, the flip-flop in the last test cell is initialized to logic one, the flip-flop in the second-to-last test cell is initialized to logic zero, the flip-flop in the third-to-last test cell is initialized to logic one, and so on. Further, if there are an odd number of test cells that form the shift register, the second MUX input for the first test cell is inverted, as shown in FIG. 5. Conversely, if there are an even number of test cells that form the shift register, the second MUX input for the first test cell is not inverted, as shown in FIG. 7.

Applicants have found that embodiments of the present invention can result in a significant reduction in testing time and costs. For the exemplary FPGA embodiment of FIG. 3, where each CLB tile includes four slices 400 and receives input signals on 4 direct lines 214, the test cells and structures of the present invention can test the direct lines and each of their corresponding 8 fan-outs using approximately 34 test patterns. In contrast, the conventional fault testing technique described in the background section of this disclosure requires approximately 200 test patterns to test the direct lines and their corresponding fan-outs for a similar FPGA architecture.

Figure 9:
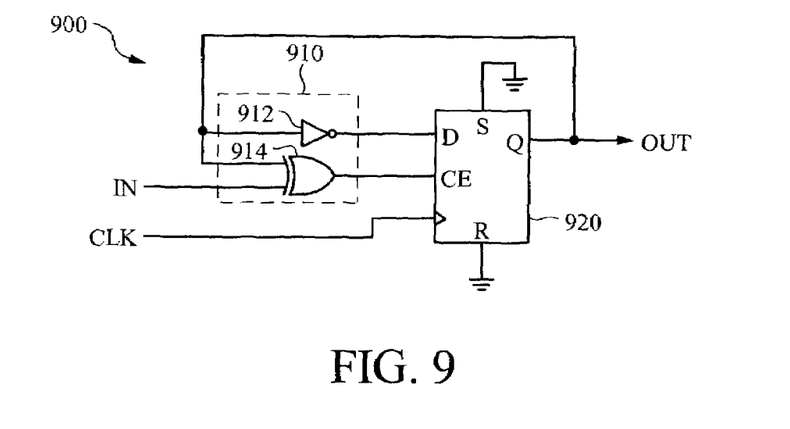
FIG. 9 is a circuit diagram illustrating another embodiment of a test cell that can be implemented within the slice of FIG. 4.

Embodiments of the present invention can also be used to test the clock enable input, the set input, and the reset input to the flip-flops within each CLE slice. FIG. 9 illustrates a test cell configuration 900 that can be used to test the clock enable input to each flip-flop in slices 400 of FPGA 100. Test cell 900 is implemented using a function generator 910 (e.g., function generator F) and corresponding flip-flop 920 (e.g., FF1) in a slice. Function generator 910 is configured to implement an inverter 912 and an XOR gate 914. XOR gate 914 has a first input to receive an input signal IN provided by a direct line 214, a second input to receive the output signal OUT from FF 920, and an output coupled to the clock enable input of FF 920. Inverter 912 is coupled between the output Q of FF 920 and the D-input of FF 920. The clock input to FF 920 receives the clock signal CLK. The set and reset inputs of FF 920 are grounded (e.g., de-asserted).

Figure 10:
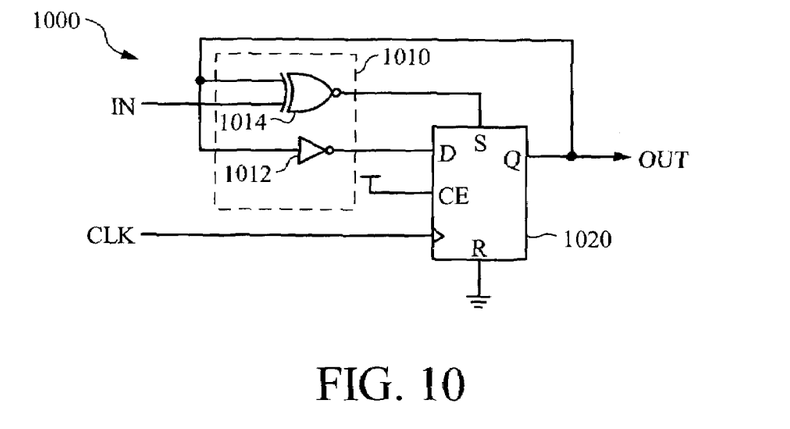
FIG. 10 is a circuit diagram illustrating yet another embodiment of a test cell that can be implemented within the slice of FIG. 4.

FIG. 10 illustrates a test cell configuration 1000 that can be used to test the set input to each flip-flop in slices 400 of FPGA 100. Test cell 1000 is implemented using a function generator 1010 (e.g., function generator F) and corresponding flip-flop 1020 (e.g., FF1) in a slice. Function generator 1010 is configured to implement an inverter 1012 and an XNOR gate 1014. XNOR gate 1014 has a first input to receive an input signal IN provided by a direct line 214, a second input to receive the output signal OUT from FF 1020, and an output coupled to the set input of FF 1020. Inverter 1012 is coupled between the output Q of FF 1020 and the D-input of FF 1020. The clock input to FF 1020 receives the clock signal CLK. The clock enable input to FF 1020 is tied to $V_{cc}$, (e.g., asserted), and the reset input of FF 1020 is grounded (e.g., de-asserted).

Figure 11:
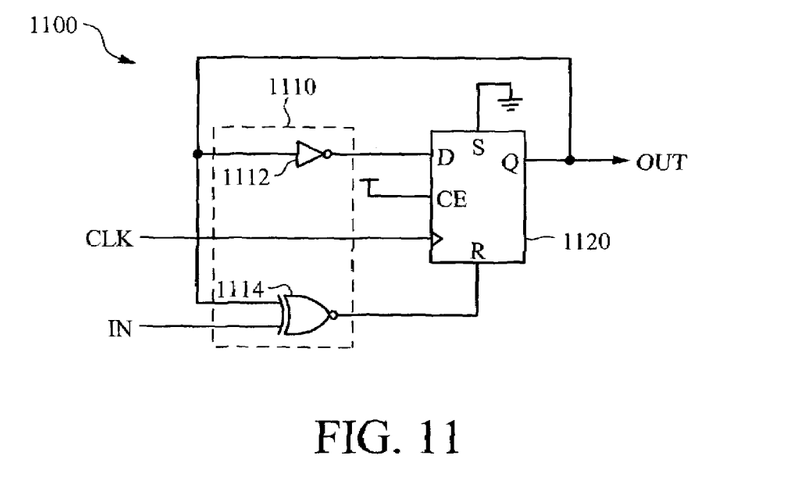
FIG. 11 is a circuit diagram illustrating still another embodiment of a test cell that can be implemented within the slice of FIG. 4.
Figure 11A:
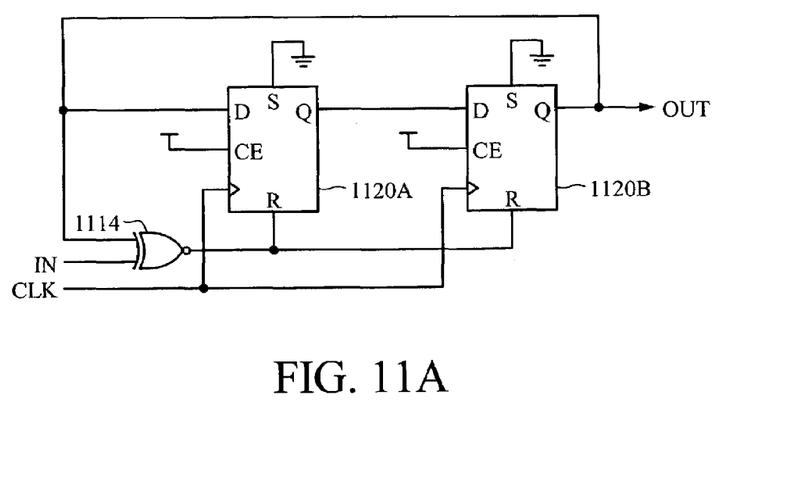
FIG. 11A is a circuit diagram illustrating the cascade connection of two of the test cells of FIG. 11.

FIG. 11 illustrates a test cell configuration 1100 that can be used to test the reset input to each flip-flop in slices 400 of FPGA 100. Test cell 1100 is implemented using a function generator 1110 (e.g., function generator F) and corresponding flip-flop 1120 (e.g., FF1) in a slice. Function generator 1100 is configured to implement an inverter 1112 and an XNOR gate 1114. XNOR gate 1114 has a first input to receive an input signal IN provided by a direct line 214, a second input to receive the output signal OUT from FF 1120, and an output coupled to the reset input of FF 1120. Inverter 1112 is coupled between the output Q of FF 1120 and the D-input of FF 1120. The clock input to FF 1120 receives the clock signal CLK. The clock enable input to FF 1120 is tied to $V_{cc}$ (e.g., asserted), and the set input of FF 1120 is grounded (e.g., de-asserted).

Figure 9A:
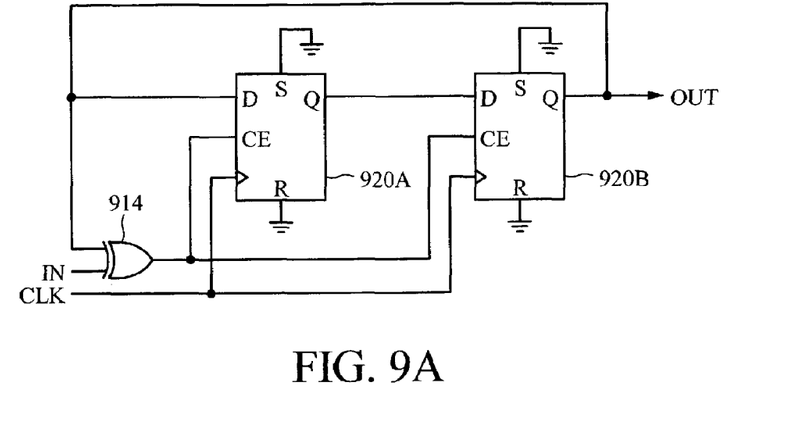
FIG. 9A is a circuit diagram illustrating the cascade connection of two of the test cells of FIG. 9.
Figure 10A:
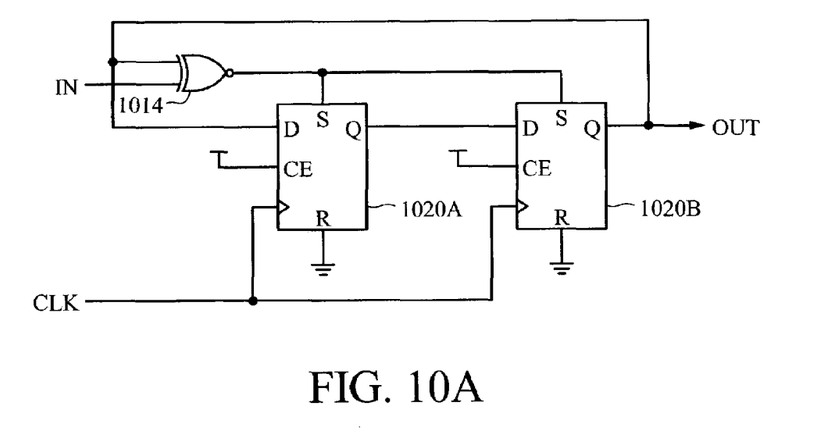
FIG. 10A is a circuit diagram illustrating the cascade connection of two of the test cells of FIG. 10.

The test cells 900, 1000, and 1100 each behave like a register, and therefore can be cascaded with other test cells configured in accordance with the present invention in the manner described above. For example, FIG. 9A shows two test cells 900A and 900B of FIG. 9 cascaded together, FIG. 10A show two test cells 1000A and 1000B of FIG. 10 cascaded together, and FIG. 11B shows two test cells 1100A and 1100B of FIG. 11 cascaded together.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A test structure including a first plurality of cascaded test cells, each of the test cells comprising:
   a flip-flop having an input and an output;
   an XOR gate having a first input coupled to a corresponding fan-out of a direct line, a second input coupled to an output terminal of the test structure, and an output; and
   a multiplexer having a first input coupled to the output of the flip-flop, a second input coupled to the output of the flip-flop in a previous test cell, a select terminal coupled to the output of the XOR gate, and an output coupled to the input of the flip-flop.

2. The test structure of claim 1, wherein the XOR gate and the multiplexer are implemented in a function generator.

3. The test structure of claim 2, wherein the function generator comprises a look-up table.

4. The test structure of claim 1, wherein the output of the flip-flop in the final test cell is connected to the output terminal of the test structure.

5. The test structure of claim 4, wherein the second input of the multiplexer in the first test cell receives the output of the flip-flop in the final test cell.

6. The test structure of claim 1, wherein the flip-flops in adjacent test cells are initialized to opposite logic states.

7. The test structure of claim 6, wherein the second input of the multiplexer in the first test cell comprises an inverter when there are an odd number of test cells cascaded together.

8. The test structure of claim 1, wherein the first plurality of test cells are implemented within a first tile of a programmable logic device (PLD).

9. The test structure of claim 8, wherein the direct line provides direct signal routing between the first tile and another tile of the PLD.

10. The test structure of claim 9, further comprising a second plurality of test cells implemented in a second tile of the PLD, wherein the first and second plurality of test cells are cascaded together.

11. A test structure implemented within a programmable logic device (PLD), the test structure including a plurality of cascaded test cells, and generating an output test signal responsive to an input test signal, each of the test cells comprising:
    a flip-flop having an input and an output;
    an XOR gate having a first input to receive the input test signal, a second input to receive the output test signal, and an output to generate a select signal; and
    a multiplexer having a first input coupled to the output of the flip-flop, a second input coupled to the output of the flip-flop in a previous test cell, a select terminal to receive the select signal, and an output coupled to the input of the flip-flop.

12. The test structure of claim 11, wherein the first input of each XOR gate receives the input signal from a corresponding fan-out of a direct line.

13. The test structure of claim 11, wherein the direct line provides direct signal routing between selected tiles of the PLD.

14. The test structure of claim 11, wherein the XOR gate and multiplexer are implemented in a function generator.

15. The test structure of claim 14, wherein the function generator comprises a look-up table.

16. The test structure of claim 11, wherein pairs of the test cells are implemented in corresponding tile slices of the PLD.

17. The test structure of claim 16, wherein the test cells form a shift register.

18. The test structure of claim 17, wherein the shift register spans a plurality of tiles of the PLD.

19. A test structure including a plurality of test cells implemented in a tile of a programmable logic device (PLD) and connected together to generate an output test signal responsive to an input test signal, each of the test cells modeling a register and comprising:
    a flip-flop to store a test bit corresponding to the test cell;
    a first input to receive the input test signal;

a second input to receive the output test signal;
a third input to receive the test bit; and
a fourth input to receive an output of a previous test cell;
wherein the test cell maintains the test bit in its current logic state when the input test signal equals the output test signal and toggles the test bit when the input test signal does not equal the output test signal.

20. The test structure of claim 19, wherein the first input of each test cell comprises a corresponding fan-out of a direct line coupled to the tile.

21. The test structure of claim 19, wherein the test structure is connected to other test structures implemented in other tiles of the PLD.

22. The test structure of claim 19, wherein the test cell further comprises:
an XOR gate having first and second inputs to receive the test input and test output signals, respectively, and having an output to generate a select signal; and
a multiplexer having a first input to receive the test bit, a second input to receive the test bit corresponding to the previous test cell, a select terminal to receive the select signal, and an output coupled an input of the flip-flop.

23. The test structure of claim 22, wherein the XOR gate and the multiplexer are implemented within a look-up table.

24. The test structure of claim 19, wherein the test cell further comprises:
an XNOR gate having first and second inputs to receive the test input and test output signals, respectively, and having an output coupled to a clock enable terminal of the flip-flop; and
an inverter coupled between an input and an output of the flip-flop.

25. The test structure of claim 24, wherein the XOR gate and the inverter are implemented within a look-up table.

26. The test structure of claim 19, wherein the test cell further comprises:
an XNOR gate having first and second inputs to receive the test input and test output signals, respectively, and having an output coupled to a set/reset terminal of the flip-flop; and
an inverter coupled between an input and an output of the flip-flop.

27. The test structure of claim 26, wherein the XOR gate and the inverter are implemented within a look-up table.

28. A test structure including a plurality of test cells connected in a chain to generate an output test signal responsive to an input test signal, each of the test cells comprising:
a storage element for storing a test bit corresponding to the test cell;
means for comparing the input test signal to the output test signal to generate a select signal; and
means for providing either the test bit or the test bit corresponding to a previous test cell to the storage element in response to the select signal.

29. The test structure of claim 28, wherein the means for comparing and the means for providing are implemented in a look-up table within a tile of a programmable logic device (PLD).

30. The test structure of claim 29, wherein the storage element comprises a flip-flop.

31. The test structure of claim 29, wherein each test cell receives the input test signal from a corresponding fan-out of a direct line coupled to the tile.

32. The test structure of claim 29, wherein the test cells are cascaded across a plurality of tile slices.

33. In a programmable logic device (PLD), a method of testing a direct line and any number of its fan-outs for faults, comprising:
implementing a plurality of test cells within a tile of the PLD;
cascading the test cells together to form a shift register;
connecting one input of each test cell to a corresponding fan-out of the direct line;
within each test cell:
comparing a test signal to an output signal of the test structure to generate a select signal; and
selectively toggling a test bit corresponding to the test cell in response to the select signal; and
initializing the test bits of adjacent test cells to opposite logic states.

34. The method of claim 33, further comprising:
implementing a pair of the test cells in each of a plurality of slices within a tile of the PLD.

35. The method of claim 34, further comprising:
cascading the test cells in the tile to other test cells implemented in other tiles of the PLD.

36. The method of claim 33, further comprising:
providing a test signal simultaneously to each of the test cells using the corresponding fan-outs of the direct line; and
shifting the test signal through the shift register.

37. The method of claim 33, wherein the comparing and selectively toggling are implemented within a function generator.

38. The method of claim 37, wherein the function generator comprises a look-up table.

* * * * *